US006217722B1

(12) United States Patent
Jankowski et al.

(10) Patent No.: US 6,217,722 B1
(45) Date of Patent: Apr. 17, 2001

(54) PROCESS FOR PRODUCING TI-CR-AL-O THIN FILM RESISTORS

(75) Inventors: Alan F. Jankowski, Livermore; Anthony P. Schmid, Solana Beach, both of CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 09/476,764

(22) Filed: Jan. 3, 2000

Related U.S. Application Data

(62) Division of application No. 09/106,324, filed on Jun. 29, 1998.

(51) Int. Cl.[7] ........ C23C 14/34

(52) U.S. Cl. ........ 204/192.21; 204/192.15; 204/192.22

(58) Field of Search ........ 204/192.15, 192.21, 204/192.22, 298.13

(56) References Cited

U.S. PATENT DOCUMENTS 5,178,739 * 1/1993 Barnes et al. ........ 204/192.12
5,693,203 * 12/1997 Ohhashi et al. ........ 204/298.2
5,742,117 * 4/1998 Spindt et al. ........ 313/422
5,865,967 * 2/1999 Hiai et al. ........ 204/281

* cited by examiner

*Primary Examiner*—Nam Nguyen
*Assistant Examiner*—Steven H. VerSteeg
(74) *Attorney, Agent, or Firm*—John P. Wooldridge; Alan H. Thompson

(57) ABSTRACT

Thin films of Ti-Cr-Al-O are used as a resistor material. The films are rf sputter deposited from ceramic targets using a reactive working gas mixture of Ar and $O_2$. Resistivity values from $10^4$ to $10^{10}$ Ohm-cm have been measured for Ti-Cr-Al-O film <1 μm thick. The film resistivity can be discretely selected through control of the target composition and the deposition parameters. The application of Ti-Cr-Al-O as a thin film resistor has been found to be thermodynamically stable, unlike other metal-oxide films. The Ti-Cr-Al-O film can be used as a vertical or lateral resistor, for example, as a layer beneath a field emission cathode in a flat panel display; or used to control surface emissivity, for example, as a coating on an insulating material such as vertical wall supports in flat panel displays.

16 Claims, 2 Drawing Sheets

PROCESS FOR PRODUCING TI-CR-AL-O THIN FILM RESISTORS

RELATED APPLICATION

This application is a division of U.S. application Ser. No. 09/106,324, filed Jun. 29, 1998.

The United States Government has rights in this invention pursuant to Contract No. W-7405-ENG-48 between the United States Department of Energy and the University of California for the operation of Lawrence Livermore National Laboratory.

BACKGROUND OF THE INVENTION

The present invention relates to resistive thin films, particularly to metal-oxide thin film resistors, and more particularly to Ti-Cr-Al-O thin film resistors and a process for fabricating same.

The development of metal-oxide materials has been widely pursued in the electronics industry for use as resistive thin films. The use of multiple phases provides a path to change the film resistivity. See C. A. Neugebauer, "Resistivity of Cermet Films Containing Oxides Of Silicon", *Thin Solid Films,* 6 (1970), 443–447. The dependence of sheet resistivity on composition is well established for systems such as Cr-Si-O. See R. Glang et al., "Resistivity and Structure of Cr-SiO Cermet Films", *J. Vac. Sci. Technol.,* 4 (1967), 163–170; A. A. Milgram et al., "Electrical and Structural Properties of Mixed Chromium and Silicon Monoxide Films", *J. Appl. Phys.,* 39 (1968), 4219–4224; N. C. Miller et al., "Co-sputtered Cermet Films", *Solid State Tech.,* 11 (1968), 28–30; and H. Steemers et al., "Stable Thin Film Resistors For Amorphous Silicon Integrated Circuits", *Mat. Res. Soc. Symp. Proc.,* 118 (1988), 445–449. The conduction mechanism for these cermet materials (materials composed of ceramics and metals) can be considered quantum mechanical. See J. E. Morris, "Structure and Electrical Properties of Au-SiO Thin Film Cermets", *Thin Solid Films,* 11 (1972), 299–311. For low metallic concentrations, the charge transport is proposed to be by electron tunneling between the metallic particles. See B. E. Springett, "Conductivity Of A System Of Metallic Particles Dispersed In An Insulating Medium", *J. Appl. Phys.,* 44 (1973), 2925–2926. In general, conduction may be considered to be by means of an activated charge transport process. For film resistivities $>10^{-2}$ Ohm-cm, the microstructure is usually comprised of a continuous insulating matrix in which metallic particles are dispersed. An increase in metallic content produces a decrease ion sheet resistivity. For the Cr-Si-O system, the insulating matrix is based on the oxide phase of $SiO_2$, with Cr, silicides, and monoxides serving as conductors/semiconductors. A general observation by Neugebauer, Supra, suggests that the $SiO_2$ composition alone could be used to determine the cermet film resistivity to within two orders of magnitude irrespective of deposition technique or conditions. Whereas this summation may represent a general trend, it is not an inclusive statement for the resistivity behavior of Cr-Si-O cermets. Initial work at the Lawrence Livermore National Laboratory with the Cr-Si-O cermet system has shown a widely varying range of resistivities that span more than twelve-orders of magnitude and are often accompanied by a non-linear current-voltage behavior. See A. Jankowski et al., "Resistivity Behavior Of Cr-Si-O Thin Films", Chem. Phys. Nanostructures and Related Non-Equilibrium Materials, ed. E. Ma. et al., The Minerals, Metals and Materials Soc. Proc. (1997), pg. 211–219. In addition, post-deposition vacuum annealing can cause changes in the resistivity by several orders of magnitude rendering unreliable use of the Cr-Si-O film as a resistor layer of constant value. Due to the limitations of producing a consistent resistivity from $10^5$ to $10^8$ Ohm-cm for the Cr-Si-O system, an alternate material has been sought which would have a well-defined and stable behavior as a resistor layer.

The present invention provides the sought for alternate for the Cr-Si-O system, and it has been determined that the system of the present invention has a well-defined and stable behavior as a resistor layer. The Ti-Cr-Al-O cermet of the present invention is being developed for use as a thin film resistor since its properties in bulk form are favorable and controllable. The Ti-Cr-Al-O films are radio frequency (rf) sputter deposited to transfer the target composition to the growing cermet film. The films are rf sputter deposited from ceramic targets using a reactive working gas mixture of Ar and $O_2$. The film resistivity can be discretely selected through target composition and the control of the deposition parameters.

SUMMARY OF THE INVENTION

It is an object of the present invention to provide metal-oxide resistive thin films which have a well-defined and stable behavior.

A further object of the invention is to provide a metal-oxide thin film which is thermodynamically stable.

A further object of the invention is to provide Ti-Cr-Al-O thin film resistors.

Another object of the invention is to provide a Ti-Cr-Al-O cermet which can be effectively utilized as a resistor material.

Another object of the invention is to provide a process for fabricating Ti-Cr-Al-O thin film resistors.

Another object of the invention is to provide a process for producing Ti-Cr-Al-O ceramic targets and films by rf sputter deposition from the ceramic targets using a reactive working gas mixture of Ar and $O_2$.

Another object of the invention is to provide a process for fabricating Ti-Cr-Al-O films wherein the resistivity of the film can be discretely selected through control of the deposition parameters.

Other objects and advantages of the invention will become apparent from the following description and accompanying drawings. The present invention is directed to Ti-Cr-Al-O cermets which can be utilized as a resistor material, and to a process for fabricating Ti-Cr-Al-O thin film resistors. The films are rf sputter deposited from ceramic targets using a reactive working gas mixture of Ar and $O_2$, and having, for example, a ceramic powder blend of 2–12% $TiO_{2,\ 30-40}$% $Al_2O_3$, and 50–65% $Cr_2O_3$, with a film composition, for example, of 1–3 at. % Ti, 15–20 at. % Cr, 10–20 at. % Al, and 58–70 at. % O. The films are deposited to a thickness >0.2 $\mu$m in order to avoid effects often seen in metal-oxide films <0.1 $\mu$m thick. See T. Filutowicz et al., "The Effects Of Film Thickness On Certain Properties Of Cr-SiO Cermet Thin Films", Electron Technology, 10 (1977), 117–126; and H. S. Hoffman et al., "Cermet Resistors On Ceramic Substrates", *IEEE Trans. On Components, Hybrids And Manufacturing Technol.,* 4 (4) (1981), 387–395. The film resistivity can be discretely selected through control of the target composition and the sputter deposition parameters. The application of Ti-Cr-Al-O as a thin film resistor has been found to be thermodynamically stable, unlike other metal-oxide material systems.

BRIEF DESCRIPTION OF THE DRAWINGS

The accompanying drawings, which are incorporated into and form a part of the disclosure illustrate an embodiment of the invention, and together with the description, serve to explain the principles of the invention.

FIG. 4 is a graph showing current-voltage behavior for Ti-Cr-Al-O films deposited a specified partial pressure of oxygen and then annealed at

DETAILED DESCRIPTION OF THE INVENTION

The present invention is directed to Ti-Cr-Al-O films for use as a resistor material, and to a process for producing these films. Ti-Cr-Al-O films have a well-defined and stable behavior as a resistor layer. The application of Ti-Cr-Al-O as a thin film resistor is found to be thermodynamically stable, unlike other metal-oxides such as Cr-Si-O. The films are rf sputter deposited from ceramic targets using a reactive working gas mixture of Ar and $O_2$, with the gas mixture for example being less than 2 % $O_2$. Resistivity varies from 10 $^4$to $10^{10}$ Ohm-cm have been measured for TiCr-Al-O films <1 μm thick. The film resistivity can be discretely selected through control of the deposition parameters. The Ti-Cr-Al-O thin films can be used as a vertical or lateral resistor, or used to control surface emissivity, for example, and thus find use as a layer beneath a field emission cathode in a flat panel display, or as a coating on an insulating material such as vertical wall supports in flat panel displays.

Figure 1:
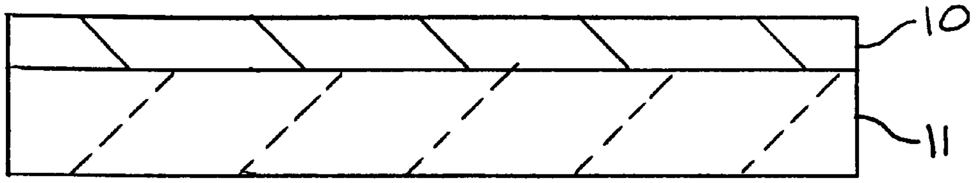
FIG. 1 is an enlarged cross sectional view of a Ti-Cr-Al-O thin film on a substrate, as made in accordance with the present invention.

The Ti-Cr-Al-O films are rf sputter deposited to transfer a ceramic target composition to the growing cermet film. The films are deposited to a thickness >0.2 μm in order to avoid adverse effects discussed above which are often seen for films <0.1μm thick. The ceramic targets, for example, are composed of laminated pieces of tape cast material as produced from ceramic powder blends of 2–14% $TiO_2$, 30–40% $Al_2O_3$, and 50–65% $Cr_2O_3$. A well-defined range of film compositions are produced over the entire range of deposition process parameters. The film composition, as measured using Rutherford Back Scattering (RBS) was found to be, for example, 1–3 at. % Ti, 15–20 at. % Cr, 10–20 at. % Al, and 58–70 at. % O for a typical target composition. FIG. 1 illustrates a Ti-Cr-Al-O film 10 deposited on a substrate 11, but the film can be deposited as a free standing film with a thickness of about 0.2–10 μm, for example, although the films can be deposited with a thickness less than 0.2 μm, down to about 0.02 μm, or to a thickness greater than 1.0 μm, up to about 50 μm.

Figure 2:
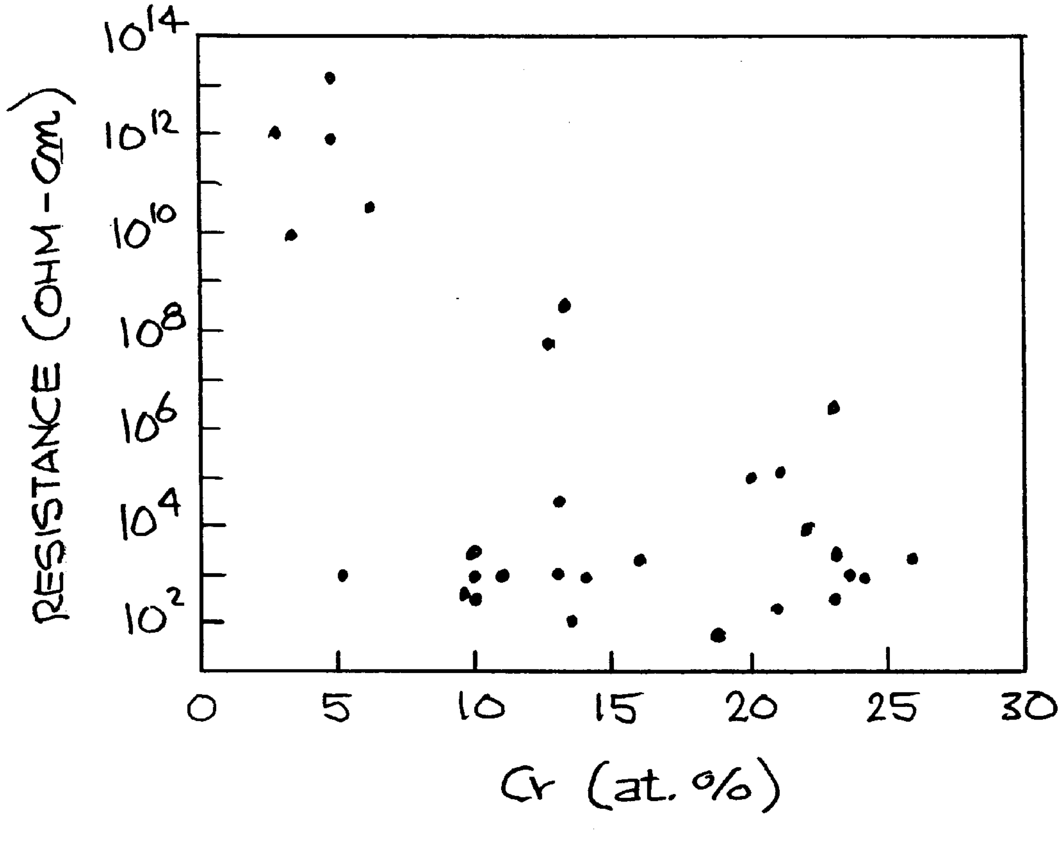
FIG. 2 is a graph showing resistance variation with varying Cr composition in sputter deposited Cr-Si-O films.
Figure 3:
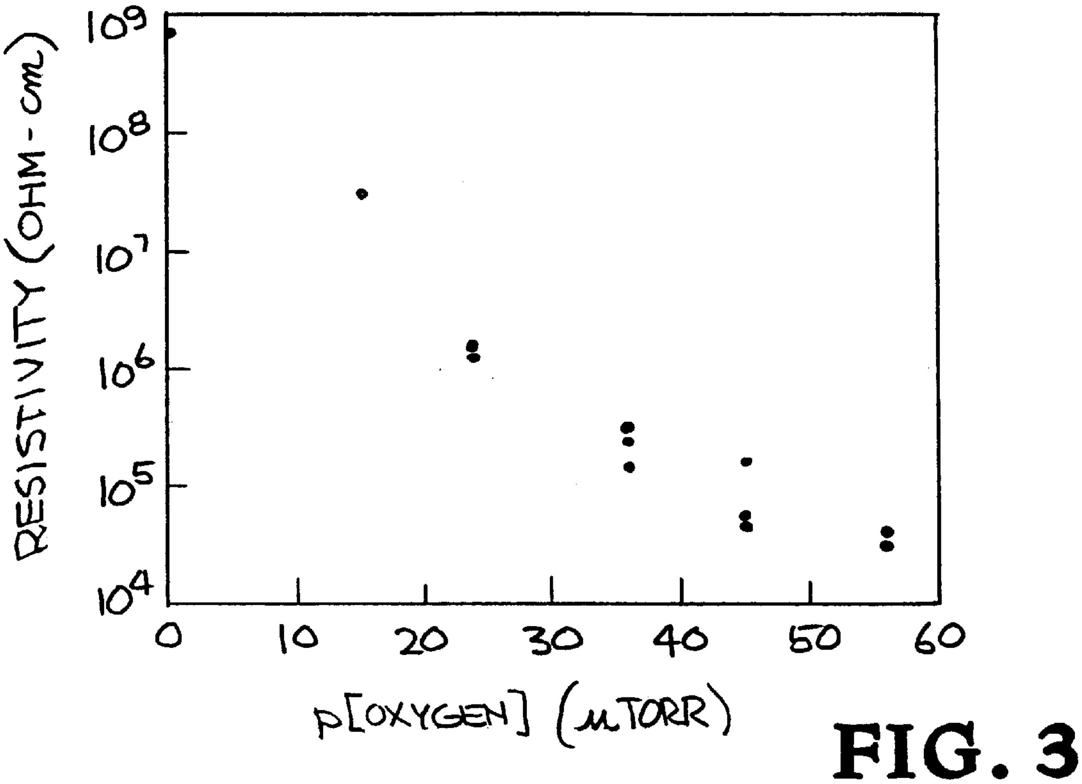
FIG. 3 is a graph showing resistivity variation of Ti-Cr-Al-O films with different oxygen partial pressures used in the sputter gas.
Figure 4:
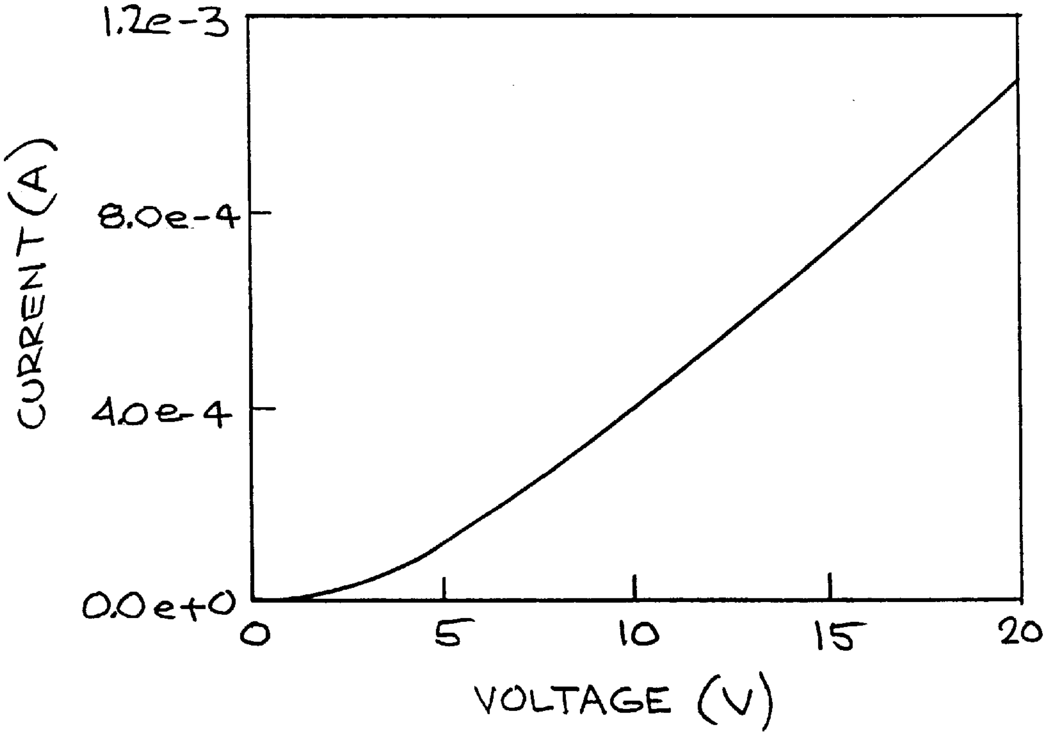

The vertical resistance of the film is measured by point contact with metal pads deposited onto the film surface. The sputter deposition parameters are selected so as to avoid thin film morphology effects. The vertical resistance should be representative of the bulk resistivity for the films. The film resistivity is dependent on its composition which can be discretely selected through control of the target composition and the sputter deposition parameters and composition of the film. For example, the resistivity of Cr-Si-O films changes relative to the Cr content therein. As shown graphically in FIG. 2, vertical resistance varies with measured Cr composition for sputter deposited Cr-Si-O films. The resistance behavior of the Cr-Si-O system is dependent on the Cr content of the film, but not in a consistent way. The vertical resistance variation with Cr content spans more than twelve-orders of magnitude. In addition, the Cr-Si-O current voltage behavior is often nonlinear. The Cr-Sir films are unstable as low temperature anneal treatments can change the resistance by several orders of magnitude. In order to develop a consistent relationship between the film composition and resistance value, a more stable material is now developed, that is Ti-Cr-Al-O. Through select control of the sputter deposition process parameters, the resistivity is found to be dependent upon the partial pressure of oxygen in the reactive sputter gas. Reproducible and thermodynamically stable resistivities from $10^5$ to $10^8$ Ohm-cm can be selected as a function of the gas composition. FIG. 3 graphically illustrates resistivity variation with oxygen partial pressure as measured at 10 volts for deposition conditions of a 6 m Torr total working gas pressure and a 6 Watts $cm^{-2}$ applied target power. The film resistivity is found to be in variant after low temperature vacuum anneals (2 hr. at 250° C.). In addition, the film is characterized by a highly desirable, linear current-voltage behavior. FIG. 4 graphically illustrates the current-voltage behavior for Ti-Cr-AlO films as deposited with 24 μTorr partial pressure of oxygen, and also as measured after 2 hours at 250° C. anneal treatment.

A detailed example of the process for producing the Ti-Cr-Al-O thin film is set forth as follows:

(1) A sputter target is prepared from ceramic powders of $TiO_2$, $Al_2O_3$ and $Cr_2O_3$. The selection of the powder mixture is related to the resistivity range desired in the thin film. For example, powder blends that are $TiO_2$-rich favor lower resistivity values in the bulk. The powders are blended and tape cast to form a thin sheet which is cut and laminated to form a right circular cylinder equivalent to the size required for the planar magnetron source. Typically, the sputter targets range in diameter from 5 mm to 8 cm and are 2 mm to 8 mm thick. A backing plate is applied to the ceramic disk to enhance thermal unloading and thereby prevent cracking of the ceramic disk which otherwise will occur during the power load applied in the sputtering process. Typically, the backing plate is thermally conducting metal, as for example, aluminum. The backing plate may be applied to the ceramic disk by a physical vapor deposition process or by a braze joining procedure. (2) The deposition chamber is evacuated to a base pressure less than $2\times10^{-7}$ Torr. A working gas of Ar and $O_2$ is brought to the desired composition through the control of flow from a premixed Ar-$O_2$ source and a pure Ar source. An increase in the oxygen partial pressure favors a decrease in the resistivity of the thin film deposit as compared to the bulk target value. The gas pressure is selected so as to avoid the deleterious effects found for thin films. Specifically, a low gas pressure is used to ensure stable target sputtering and a continuous and defect-free, for example pinhole-free, deposition of a thin film. A gas pressure ranging from 2 m Torr to 15 m Torr is typically used to operate the planar magnetron source. (3) A substrate is used with an electrically conducting surface, as for example a metal-coated silicon wafer. The metal may be, for example a 0.25 μm thick layer of nickel. The substrate temperature is controlled by heating or cooling to the desired temperature. Typically, the substrate temperature is maintained at 25° C. to 50° C. The substrate is positioned a minimum distance in separation from the magnetron source to maximized deposition rate yet avoid the deleterious effects of electron sheath interaction with the growing film. This distance is typically less than 12 cm and greater than 4 cm. (4) The electrically insulating targets are most easily sputtered in the rf mode. The powder density applied to the target ranges from 2 to 20 Watts cm $^{-2}$. Over this power range the targets are found to operate without any problem, for example, continuously and without any evidence or cracking or delamination. (5) The resistor film is grown, for example, to a nominal thickness not less than 0.15 μm thick nor greater than 0.6 μm thick. This thickness range is suitable to yield an electrically insulating layer that is continuous and defect-free.

It has thus been shown that the present invention provides coatings or films of Ti-Cr-Al-O for use as a resistor material. The films are rf sputter deposited from ceramic targets using a reactive working gas mixture of Ar and $O_2$. The film resistivity can be discretely selected through control of the target composition and the sputter deposition parameters. Thus, the present invention provides a thermodynamically stable thin film resistor, unlike other metal-oxide cermets.

While specific film parameters have been exemplified and a specific process set forth for producing the films, such are not intended to be limiting. Modifications and changes may become apparent to those skilled in the art, and it is intended that the invention be limited only by the scope of the appended claims.

What is claimed is:

1. A process for producing Ti-Cr-Al-O material including rf sputter depositing of the Ti-Cr-Al-O from a ceramic target using a reactive working gas mixture of Ar and $O_2$.

the rf sputter depositing being carried out so as to provide the material with a resistivity range of about $10^4$ to about $10^{10}$ Ohm-cm.

2. The process of claim 1, additionally including inhibiting the onset of target failure during sputtering by the application of a thermal conductive backing plate to the target.

3. The process of claim 1, additionally including providing the ceramic target composed of laminated pieces of tape cast material.

4. The process of claim 1, additionally including forming the ceramic target using ceramic powder blends of 2–14% $TiO_2$, 30–40% $Al_2$ $O_3$, and 50–65% $Cr_2O_3$.

5. The process of claim 1, additionally including depositing the Ti-Cr-Al-O to a thickness of about 0.2 μm to 1.0 μm.

6. The process of claim 1, wherein the rf sputter depositing produces a film consisting of 1–3 at. % Ti, 15–20 at. % Cr, 10–20 at. % Al, and 58–70 at. % O.

7. The process of claim 1, additionally including controlling the resistivity of the Ti-Cr-Al-O material by controlling target composition and deposition parameters including the partial pressure of oxygen in the reactive gas mixture.

8. The process of claim 7, additionally including providing the ceramic target with a thermal conductive backing plate for inhibiting target failure during sputtering.

9. The process of claim 1, additionally including depositing the Ti-Cr-Al-O to a thickness of about 0.02–50 μm.

10. The process of claim 1, additionally including depositing the Ti-Cr-Al-O on a substrate.

11. A process for producing a thin film resistor consisting of Ti-Cr-Al-O including rf sputter depositing of the Ti-Cr-Al-O from a ceramic target using a reactive working gas mixture of Ar and $O_2$, the rf sputter depositing being carried out so as to provide a thin film resistor with a resistivity range of about $10^4$ to about 10 $^{10}$Ohm-cm.

12. The process of claim 11, additionally including forming a ceramic target using ceramic powder blends of 2–14% $TiO_2$, 30–40% $Al_2O_3$, 50–65% $Cr_2O_3$.

13. The process of claim 11, additionally including depositing the Ti-Cr-Al-O to a thickness of about 0.02 μm to about 50 μm.

14. The process of claim 11, wherein the rf sputter depositing produces a thing film resistor consisting of 1–3 at % Ti, 15–20 at, % Cr., 10–20 at % Al, and 58–70 at % O.

15. The process of claim 11, wherein the rf sputter deposition is carried out using on energy in the range of about 2 to about 20 Watts $Cm^{-2}$.

16. The process of claim 11, additionally including forming the reactive working gas mixture so as to be composed of less than 2% $O_2$ with a balance of Ar.

* * * * *